(12) United States Patent
Chen

(10) Patent No.: US 11,217,521 B2
(45) Date of Patent: Jan. 4, 2022

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Xia Chen, Wuhan (CN)

(*) Notice: Subject to any disclaimer, the term of this patent is extended or adjusted under 35 U.S.C. 154(b) by 251 days.

(21) Appl. No.: 16/629,562

(22) PCT Filed: Oct. 14, 2019

(86) PCT No.: PCT/CN2019/110960
§ 371 (c)(1),
(2) Date: Jan. 9, 2020

(87) PCT Pub. No.: WO2020/248446
PCT Pub. Date: Dec. 17, 2020

(65) Prior Publication Data
US 2021/0175156 A1 Jun. 10, 2021

(30) Foreign Application Priority Data
Jun. 13, 2019 (CN) .......................... 201910508787.5

(51) Int. Cl.
*H01L 27/12* (2006.01)
*H01L 27/32* (2006.01)
*H01L 23/498* (2006.01)

(52) U.S. Cl.
CPC .... *H01L 23/4985* (2013.01); *H01L 23/49838* (2013.01); *H01L 27/124* (2013.01); *H01L 27/1244* (2013.01); *H01L 27/3276* (2013.01); *H01L 27/3288* (2013.01)

(58) Field of Classification Search
None
See application file for complete search history.

(56) References Cited

U.S. PATENT DOCUMENTS

| 2016/0231784 A1 | 8/2016 | Yu et al. |
| 2018/0248139 A1* | 8/2018 | Zhai .................... H01L 27/3276 |
| 2021/0183276 A1* | 6/2021 | Wang ...................... G09F 9/301 |

FOREIGN PATENT DOCUMENTS

| CN | 108877513 A | 11/2018 |
| CN | 109616493 A | 4/2019 |
| CN | 109637369 A | 4/2019 |
| CN | 109671761 A | 4/2019 |
| CN | 109817675 A | 5/2019 |
| CN | 109859625 A | 6/2019 |
| CN | 109860252 A | 6/2019 |

* cited by examiner

*Primary Examiner* — Evren Seven

(57) ABSTRACT

The invention provides a display panel including a display area and a non-display area, wherein the non-display area is provided with a plurality of signal transmission lines, and the non-display area includes a bending region on a side of the display area. In the bending region, at least one hole is disposed at intervals on one of the signal transmission lines and the hole is filled with a high ductility metal.

10 Claims, 3 Drawing Sheets

DISPLAY PANEL

BACKGROUND OF INVENTION

Field of Invention

The present invention relates to the field of display technologies, and in particular, to a display panel.

Description of Prior Art

At present, one of the important ways to achieve a large screen-to-body ratio and a narrow bezel is to bend a component such as a metal trace or the like to the back of the display panel to form a bending region. Recently, electronic products have been developed toward thinner and lighter, which requires a radius of the bending region to be smaller and smaller.

However, while the radius of the bending region is reduced, stress on a signal transmission line in the bending region is increased, which causes the signal transmission line to break. When the signal transmission line is broken, the signal cannot be transmitted to the display area, greatly impacting display quality of a display panel.

Therefore, there is a need to provide a new display panel to solve the above problems.

SUMMARY OF INVENTION

The present invention provides a display panel, which can reduce stress of a signal transmission line during bending, and reduce a risk of breakage of the signal transmission line during bending, so as to solve the technical problem that the signal transmission line in the bending region of the existing display panel is easily broken during bending.

In order to solve the above problem, the technical solutions provided by the present invention are as follows:

An embodiment of the present invention provides a display panel, where the display panel, provided with a plurality of signal transmission lines, and including a display area and a non-display area, the non-display area including a bending region on a side of the display area, wherein in the bending region, at least one hole is disposed at intervals on one of the signal transmission lines and the hole is filled with a high ductility metal.

In the display panel provided by an embodiment of the present application, the hole extends through the one of the signal transmission lines.

In the display panel provided by an embodiment of the present application, the high ductility metal has an elongation rate of more than 5% at 25° C.

In the display panel provided by an embodiment of the present application, the high ductility metal includes at least one of a nickel-containing alloy, silver, and aluminum.

In the display panel provided by an embodiment of the present application, the high ductility metal filled in the holes is in a block shape.

In the display panel provided by an embodiment of the present application, the high ductility metal filled in the holes is in a grid shape.

In the display panel provided by an embodiment of the present application, an orthographic projection of each of the signal transmission lines on the display panel includes a first boundary line and a second boundary line, and a distance between an orthographic projection of the hole on the display panel and the first boundary line and a distance between the orthographic projection of the hole on the display panel and the second boundary line both range from 2 μm to 5 μm.

In the display panel provided by an embodiment of the present application, the hole has a shape including at least one of a circle, an ellipse, and a polygon.

In the display panel provided by an embodiment of the present application, the hole has an elliptical shape, a long axis of the hole is parallel to an extending direction of the signal transmission lines, and a short axis of the hole is perpendicular to the extending direction of the signal transmission lines, wherein the long axis has a length of 2 μm to 20 μm, and the short axis has a length of 2 μm to 10 μm.

In the display panel provided by an embodiment of the present application, the signal transmission lines are provided with a plurality of holes which are evenly distributed on the signal transmission lines.

The present invention provides a display panel, wherein at least one hole is disposed at intervals on one of the signal transmission lines in a bending region, and the hole is filled with a high ductility metal. The stress of the signal transmission lines during bending is reduced by disposing the hole, such that the stress can be evenly distributed around the hole, and the filled high ductility metal can further balance the stress distribution at the hole, and the hole and the high ductility metal can reduce a risk of breakage of the signal transmission lines during bending. The high ductility metal has an elongation rate of more than 5%, and has high ductility and good plasticity. Even if the signal transmission line is inadvertently broken in the portion where the hole is provided, the high ductility metal can be transmitted a signal to the display area smoothly by its own ductility and plasticity, thus ensuring normal display of the display panel, and enhancing reliability of the display panel.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

Figure 1:
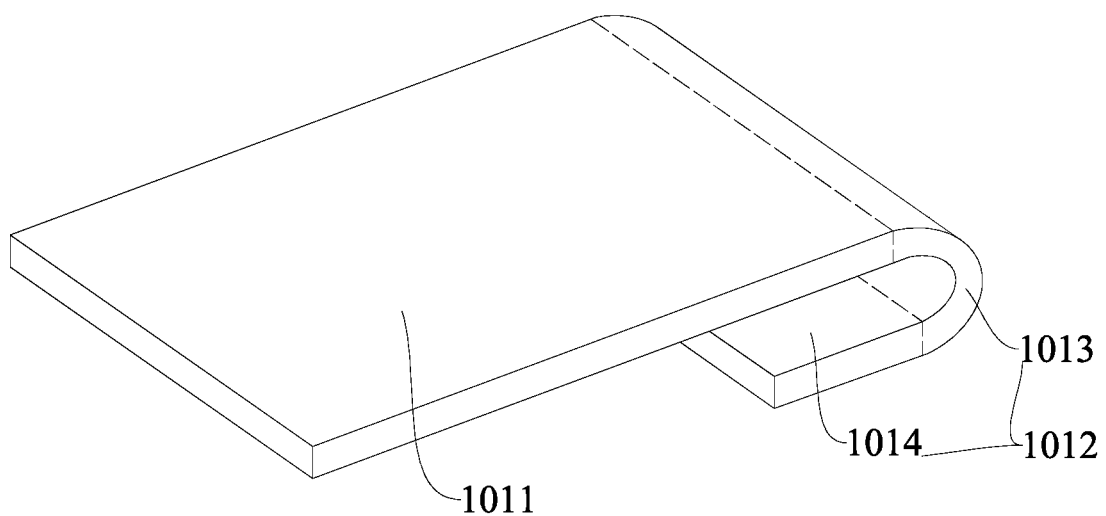
FIG. 1 is a schematic structural diagram of a conventional display panel.

Referring to FIG. 1, the display panel may include a display area 1011 and a non-display area 1012. The non-display area 1012 may further include a bending region 1013 on a side of the display area 1011.

The non-display area 1012 may further include a binding region 1014. In order to increase a screen-to-body ratio of the display area and reduce an edge width below the display area, the display panel is bent at a position corresponding to the bending region 1013 to a back of the display area 1011, and the portion bound to the back of the display area 1011 is the binding region 1014. Since the bending region 1013 is provided with a plurality of signal transmission lines, stress in the signal transmission lines is excessively large during bending, and is easily concentrated in bent portions of the signal transmission lines, causing the signal transmission lines to break during bending, so that a transmission signal cannot be normally transmitted to the display area, causing abnormal display of the display panel.

In view of the above drawbacks, an embodiment of the present invention provides a display panel, the display panel is provided with a plurality of signal transmission lines, the display panel includes a display area and a non-display area, and the non-display area further includes a bending portion on a side of the display area, wherein in the bending region, at least one hole is disposed at intervals on one of the signal transmission lines and the hole is filled with a high ductility metal. The technical solution of an embodiment of the present invention is that in the bending region, at least one hole is disposed at intervals on one of the signal transmission lines and the hole is filled with a high ductility metal, to reduce a risk of breakage of the signal transmission lines in the bending region during bending, enhance a conduction performance of the signal transmission lines, and transmit a transmission signal to the display area more smoothly, thus ensuring normal display of the display panel and enhancing the reliability of the display panel.

The above is the core idea of the present invention, and the technical solutions in the embodiments of the present invention will be clearly and completely described below in conjunction with the accompanying drawings in the embodiments of the present invention. Based on the embodiments of the present invention, all other embodiments obtained by those skilled in the art without creative efforts are within the scope of protection of the present invention.

Figure 2:
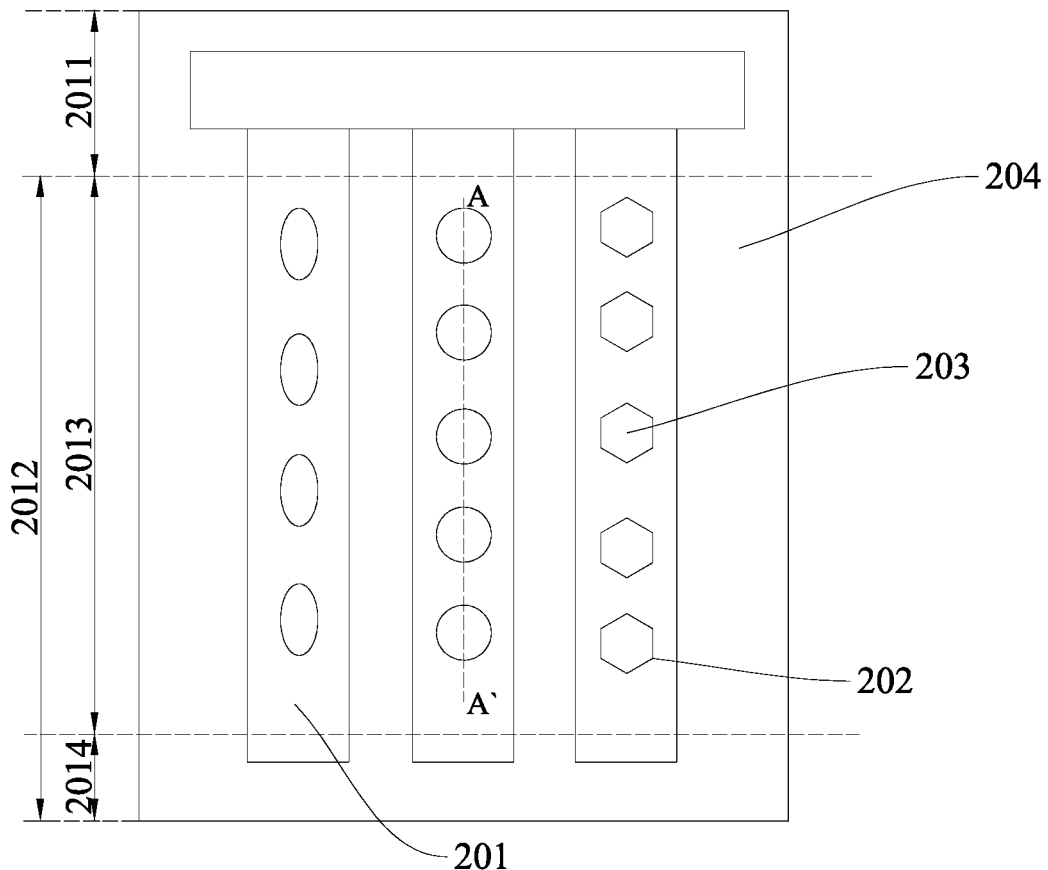
FIG. 2 is a schematic structural diagram of a display panel according to an embodiment of the present invention.

Referring to FIG. 2, the display panel according to an embodiment of the present invention is provided with a plurality of signal transmission lines 201. The display panel includes a display area 2011 and a non-display area 2012, and the non-display area 2012 further includes a bending region 2013 one a side of the display area, wherein in the bending region 2013, at least one hole 202 is disposed at intervals on one of the signal transmission lines 201 and the hole 202 is filled with a high ductility metal 203.

The non-display area 2012 may further include a binding region 2014, wherein the binding region 1014 is the portion bound to the back of the display area 2011, the binding region 1014 is provided with a driving device, and the binding region 2014 outputs a transmission signal, which is transmitted to the display area 2011 via the signal transmission line 201. The display panel may further include a base substrate 204, and the signal transmission lines 201 are disposed on a surface of the base substrate 204.

Figure 3:
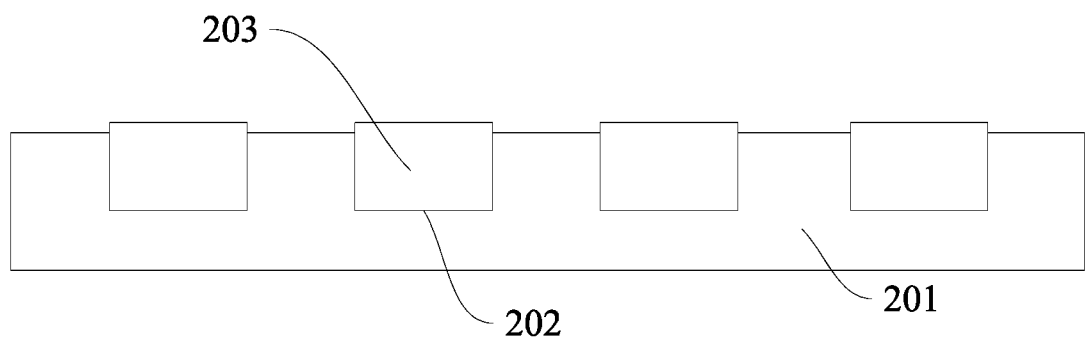
FIG. 3 is a schematic diagram showing a cross-sectional structure at the line A-A' in FIG. 2.

Referring to FIG. 3, according to an embodiment of the present invention, the hole 202 is a blind hole, that is, the hole 202 has a certain depth, but the depth of the hole 202 does not exceed a thickness of the signal transmission line 201. When the bending region 2013 is bent, the blind hole is bent outward, and the high ductility metal 203 filled in the blind hole can balance the stress generated in the blind hole during bending. Moreover, the high ductility metal 203 has better conduction performance to transmit the transmission signal to the display area 2011 more smoothly.

Figure 4:
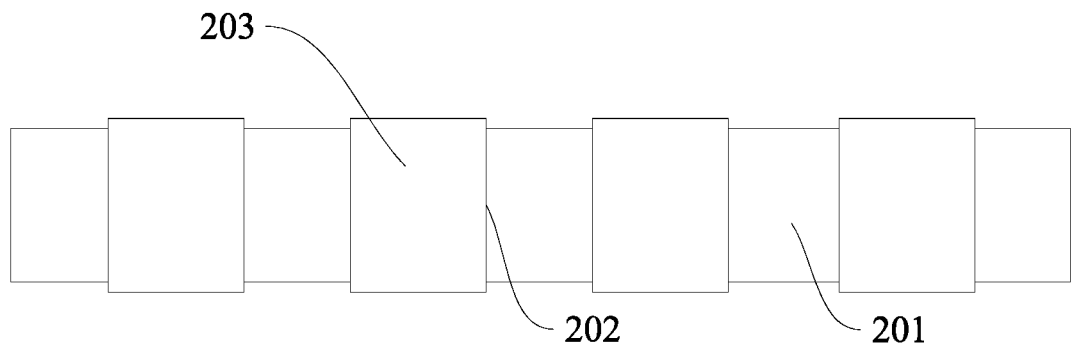
FIG. 4 is a schematic diagram showing another cross-sectional structure at the line A-A' in FIG. 2.

Referring to FIG. 4, according to another embodiment of the present invention, the hole 202 is a through hole, that is, the hole 202 penetrates the signal transmission line 201. When the hole 202 is the through hole, the stress generated in the signal transmission lines 201 during bending can be further reduced to a greater extent, the high ductility metal 203 filled in the blind hole can balance the stress generated in the through hole during bending. Moreover, the high ductility metal 203 has better conduction performance to transmit the transmission signal to the display area 2011 more smoothly.

The high ductility metal 203 of the embodiments of the present invention has relatively high ductility. In general, ductility of a metal material refers to an ability that the metal material can be extended into a filament, or can be milled into a thin slice without breaking under an action of external force. Ductility of the metal material is positively correlated with its plasticity, that is, if the ductility of metal materials is high, the plasticity of metal materials is also good. The plasticity of the metal material refers to an ability that the metal material undergoes plastic deformation (permanent deformation) under an action of an external force without being damaged. The plasticity of the metal material can be measured by an elongation rate, and the elongation rate of the metal material is larger, indicating that the better the plasticity of the metal material, and the better the plasticity of the metal material, the higher the ductility of the metal material, that is, the metal material can withstand large plastic deformation without being damaged. The high ductility metal 203 selected for an embodiment of the present invention is a metal having an elongation rate greater than 5%. Since the plasticity of the high ductility metal 203 is good, when the signal transmission lines 201 are bent, the high ductility metal 203 can use its high ductility to balance the stress generated in the signal transmission lines 201 during bending, thus avoiding the breakage of the signal transmission lines 201 during bending.

In the embodiments of the present invention, the high ductility metal 203 may be made of a metal material such as a nickel alloy, silver, or aluminum. Alternatively, the high ductility metal 203 may be made of other pure metals, modified metals, or alloys having a high ductility and an elongation rate of more than 5%.

In an embodiment of the present invention, after the hole 202 is filled with the high ductility metal 203, the region filled with the high ductility metal 203 may be higher than a surface of the signal transmission lines 201 to form a block slightly protruding from the surface of the signal transmission lines 201. Alternatively, the region filled with the high ductility metal 203 may also be level with the surface of the signal transmission lines 201. Alternatively, the region filled with the high ductility metal 203 may be slightly lower than the surface of the signal transmission lines 201. The present invention is not limited to a specific form.

In the embodiment of the present invention, when the hole 202 is filled with the high ductility metal 203, it may be a full-face filling, that is, the high ductility metal 203 fills and fills the entire interior of the hole 202 to form a block filler, and when the signal transmission lines 201 are bent, the block filler balances the stress by its good plasticity, and the high ductility metal 203 has high elongation rate and good ductility, and can be not broken when withstanding a large external force, that is, when the signal transmission lines 201 are bent, the high ductility metal 203 can be stretched to a suitable size to ensure stress balance of the signal transmission lines 201 at the bending region, to prevent the signal transmission lines 201 from breakage during bending. The high ductility metal 203 may also fill a partial region of the hole 202. In such a case, the high ductility metal 203 may be in a grid shape inside the hole 202, and after the high ductility metal 203 fills the hole 202, a certain number of hollow holes exist in the hole 202. The hollow holes allow the signal transmission lines 201 to have a certain compression space during bending, and the stress of the signal transmission lines 201 can be further reduced during bending. In addition, the high ductility metal 203 has good plasticity and high ductility, and can balance the stress distribution of the signal transmission lines 201 at the bending region, and avoid the signal transmission line 201 from breakage during bending. The high ductility metal 203 can also fill the hole 202 in other manners, as long as the stress generated in the signal transmission line 201 during bending can be balanced, and therefore the embodiments of the present invention are not particularly limited to a specific form.

Figure 5:
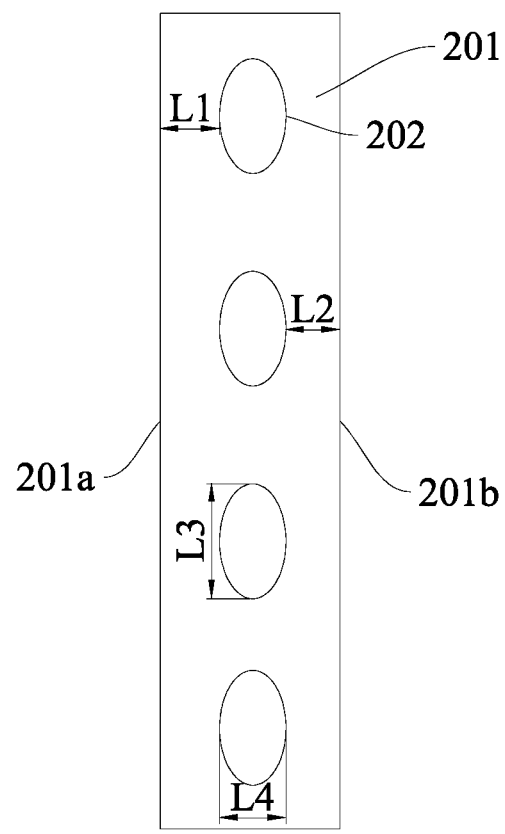
FIG. 5 is a schematic structural diagram of signal transmission lines of a display panel according to an embodiment of the present invention.

Referring to FIG. 5, a width of the signal transmission line 201 in an embodiment of the present invention is 10 µm-100 µm, and an orthographic projection of each of the signal transmission lines 201 on the display panel comprises a first boundary line 201a and a second boundary line 201b. The first boundary line 201a and the second boundary line 201b may be straight lines, so that the method of forming the signal transmission lines 201 is simple, and thus preparation is simple. A shortest distance between the orthographic projection of the hole 202 on the display panel and the first boundary line 201a is L1, and a shortest distance between the orthographic projection of the hole 202 on the display panel and the second boundary line 201b is L2. It should be noted that the orthographic projection of each of the signal transmission lines 201 on the display panel and the orthographic projection of the hole 202 on the display panel are both projection surfaces, wherein the orthographic projection of each of the transmission lines 201 on the display panel refers to a projection surface of each of the signal transmission lines 201 in a direction perpendicular to the display panel. The orthographic projection of the hole 202 on the display panel may include a plurality of cases: the projection surface of the hole 202 on the display panel and a central axis of the hole 202 is parallel, perpendicular to each other, or formed to have an angle, wherein the central axis of the hole 202 may be perpendicular to the base substrate 204, parallel to the base substrate 204, or formed to have an angle. A degree of the angle is not specifically limited in the present invention. Taking the central axis of the hole 202 perpendicular to the base substrate 204 as an example, in this case, the orthographic projection surface of the hole 202 on the display panel and the central axis of the hole 202 are perpendicular to each other, wherein $2\ \mu m \leq L1 \leq 5\ \mu m$, $2\ \mu m \leq L2 \leq 5\ \mu m$, and preferably, $3\ \mu m \leq L1 \leq 4\ \mu m$, $3\ \mu m \leq L2 \leq 4\ \mu m$. By setting $2\ \mu m \leq L1 \leq 5\ \mu m$, and $2\ \mu m \leq L2 \leq 5\ \mu m$, it is ensured that a size of the hole 202 is adapted to the width of the signal transmission lines 201, and the stress generated in the signal transmission lines 201 during bending is balanced to a maximum extent.

A shape of the hole 202 in an embodiment of the present invention may include at least one of a circle, an ellipse, and a polygon. Referring to FIG. 5, when the shape of the hole 202 is elliptical, a long axis of the hole 202 is parallel to the extending direction of the signal transmission lines 201, and a short axis of the hole 202 is perpendicular to the extending direction of the signal transmission lines 201. The length in the long axis direction is L3, and the length in the short axis direction is L4, wherein $2\ \mu m \leq L3 \leq 20\ \mu m$, and $2\ \mu m \leq L4 \leq 10\ \mu m$; and preferably, $2.5\ \mu m \leq L3 \leq 6\ \mu m$, and $3\ \mu m \leq L4 \leq 5\ \mu m$. By setting $2\ \mu m \leq L3 \leq 20\ \mu m$, $2\ \mu m \leq L4 \leq 10\ \mu m$, it is ensured that a size of the hole 202 matches the size of one of the signal transmission lines 201. A plurality of the holes 202 may be disposed on the signal transmission lines 201, to reduce the stress that the signal transmission line 201 is subjected to during bending, and the holes 202 are filled with the high ductility metal 203, which may reduce possibility of breakage of the signal transmission lines 201.

When the holes 202 are plural, the plurality of holes 202 are evenly distributed on the signal transmission lines 201, and distances between the holes 202 are moderate to ensure that when the signal transmission lines 201 are bent, the holes 202 can reduce the stress of the signal transmission lines 201 with maximum efficiency.

The signal transmission lines 201 in an embodiment of the present invention include at least one of a data line, a scan line, a touch line, and an electrode signal line. The signal transmission lines 201 are made of a material including at least one of an aluminum titanium alloy or an aluminum molybdenum alloy, which is not particularly limited in the embodiments of the present invention.

The present invention provides a display panel, wherein at least one hole is disposed at intervals on one of the signal transmission lines in a bending region, and the hole is filled with a high ductility metal. The stress of the signal transmission lines during bending is reduced by disposing the hole, such that the stress can be evenly distributed around the hole, and the filled high ductility metal can further balance the stress distribution at the hole, and the hole and the high ductility metal can reduce a risk of breakage of the signal transmission lines during bending The high ductility metal has an elongation rate of more than 5%, and has high ductility and good plasticity. Even if the signal transmission line is inadvertently broken in the portion where the hole is provided, the high ductility metal can be transmitted a signal to the display area smoothly by its own ductility and plasticity, thus ensuring normal display of the display panel, and enhancing reliability of the display panel.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, provided with a plurality of signal transmission lines, and comprising a display area and a non-display area, the non-display area comprising a bending region on a side of the display area, wherein in the bending region, at least one hole is disposed at intervals on one of the signal transmission lines and the hole is filled with a high ductility metal.

2. The display panel according to claim 1, wherein the hole extends through the one of the signal transmission lines.

3. The display panel according to claim 1, wherein the high ductility metal has an elongation rate of more than 5% at 25° C.

4. The display panel according to claim 3, wherein the high ductility metal comprises at least one of a nickel-containing alloy, silver, and aluminum.

5. The display panel according to claim 1, wherein the high ductility metal filled in the holes is in a block shape.

6. The display panel according to claim 1, wherein the high ductility metal filled in the holes is in a grid shape.

7. The display panel according to claim 1, wherein an orthographic projection of each of the signal transmission lines on the display panel comprises a first boundary line and a second boundary line, and a distance between an orthographic projection of the hole on the display panel and the first boundary line and a distance between the orthographic projection of the hole on the display panel and the second boundary line both range from 2 μm to 5 μm.

8. The display panel according to claim 1, wherein the hole has a shape comprising at least one of a circle, an ellipse, and a polygon.

9. The display panel according to claim 8, wherein the hole has an elliptical shape, a long axis of the hole is parallel to an extending direction of the signal transmission lines, and a short axis of the hole is perpendicular to the extending direction of the signal transmission lines, wherein the long axis has a length of 2 μm to 20 μm, and the short axis has a length of 2 μm to 10 μm.

10. The display panel according to claim 1, wherein the signal transmission lines are provided with a plurality of holes which are evenly distributed on the signal transmission lines.

\* \* \* \* \*